FREQUENCY SELECTIVE SEMICONDUCTOR CIRCUIT ELEMENTS

Filed Sept. 12, 1951

INVENTOR
W. SHOCKLEY
BY
[signature]
ATTORNEY

United States Patent Office 2,761,020

Patented Aug. 28, 1956

2,761,020

FREQUENCY SELECTIVE SEMICONDUCTOR CIRCUIT ELEMENTS

William Shockley, Madison, N. J., assignor to Bell Telephone Laboratories, Incorporated, New York, N. Y., a corporation of New York Application September 12, 1951, Serial No. 246,322

10 Claims. (Cl. 179—171)

This invention relates to signal transmitting devices and more particularly to frequency selective circuits including semiconductive elements.

One general object of this invention is to improve frequency selective circuits. More specific objects of this invention are to facilitate and simplify the construction of frequency selective circuits, to enable ready control of the transmission characteristics of such circuits, and to provide a filter the pass band or frequency of which may be adjusted with dispatch.

As is known, conduction in semiconductors, such as germanium, silicon, copper oxide and other elements and compounds involves transport of either electrons or holes, or both. The type of carriers normally in excess in the material depends upon or, viewed in another way, determines the conductivity type of the material. Specifically, in N-type semiconductors, the carriers normally in excess are electrons whereas in P-type semiconductors the excess carriers are holes. As is also known, and as exemplified by the class of devices commonly referred to as transitors, carriers of the sign opposite that of the carriers normally in excess in a semiconductive body can be injected into a body, as by way of a forwardly biased rectifying connection to the body, and caused to drift or flow toward an appropriately biased second connection to the body. The connection by way of which the carriers are injected is termed the emitter and the connection to which these carriers are attracted is designated the collector.

The flow of carriers along or through a semiconductor is characterized by transit times of substantial magnitudes for practical purposes. Also the flow of carriers effects a modulation of the conductivity of the material. That is to say, an increase in the number of carriers at any region in a semiconductor results in an increase in the conductivity of that region and conversely, a decrease in the number of carriers at a region effects a decrease in the conductivity at that region. Thus, if a group of carriers, closely adjacent in space, traverses a semiconductive body, incremental units along the path of traversal undergo conductivity increases in succession.

The net current obtainable at any point in a semiconductor body is determined by the number of free carriers extant at that point. Also, of course, the over-all impedance between two terminals on such a body is the sum of the incremental impedances between those terminals.

In accordance with one general feature of this invention, carriers are injected into a body of semiconductive material at one region thereof and caused to flow toward another region, and the carrier transit times and transmission characteristics of the body are correlated so that for a certain frequency, or band of frequencies, of carrier injection, the current withdrawn at the second region is substantially modulated whereas at other frequencies such current is substantially unchanged.

In accordance with a more specific feature of this invention, in a signal transmitting circuit including a semiconductive body and emitter and collector terminals, the normal resistance of the semiconductor between the terminals is varied cyclically and the transit times of the carriers injected at the emitter are made such in relation to the frequency of the input signals that for such signals of a prescribed frequency substantial variation of the effective impedance between the terminals obtains whereas at frequencies remote from the prescribed one, but little such variation obtains.

In one illustrative and specific embodiment of this invention, a filter comprises an elongated body of N-type germanium and emitter and collector connections thereto at opposite ends. The emitter is biased to inject holes into the body and a source is connected between the ends to provide a sweeping field of polarity to attract the carriers to the collector. Signal pulses are applied to the emitter and a load circuit is associated with the collector. The cross-sectional area of the germanium body is varied cyclically along the path traversed by the holes whereby alternate zones of relatively low and relatively high resistance are established. The sweeping field and lengths of the zones are made such that the hole transit time between successive points of like resistance is substantially equal to the period of the input pulses.

The invention and the above noted and other features thereof will be understood more clearly and fully from the following detailed description with reference to the accompanying drawing in which.

Figure 5:
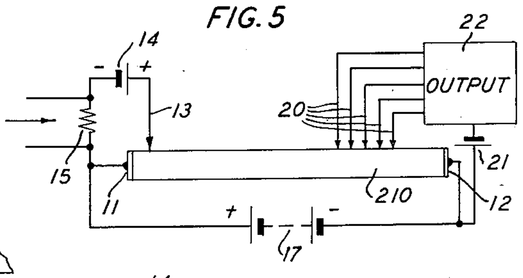
Figure 6:
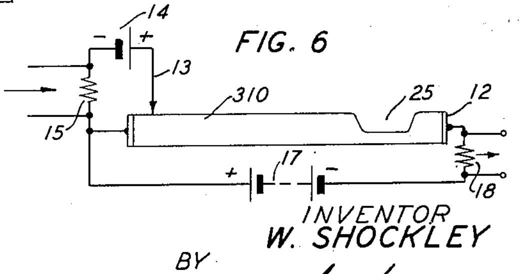

Fig. 5 portrays another illustrative embodiment of this invention involving utilization of a plurality of appropriately spaced collectors; and Fig. 6 is a diagram showing another illustrative embodiment of this invention.

As has been indicated hereinabove, semiconductors suitable for use in devices constructed in accordance with this invention may be elemental or compound. A particularly advantageous material, having uniform carrier lifetimes and transit times, is single crystal germanium. Such material may be prepared, for example, in the manner disclosed in detail in the application Serial No. 138,354, filed January 13, 1950, now Patent 2,683,676, granted July 13, 1954, of J. B. Little and G. K. Teal and involved dipping of a germanium seed into a germanium melt and withdrawing the seed at a rate substantially equal to the crystallization rate of the material. The conductivity of successive zones or regions of the drawn crystal may be controlled by adding donor or acceptor impurities, or both, to the melt as disclosed in the application Serial No. 168,184, filed June 15, 1950, now Patent 2,727,840, granted December 20, 1955, of G. K. Teal. Bodies, for example filaments, of various forms may be produced from the drawn crystal in various ways, for example in the manner disclosed in the application Serial No. 50,896, filed September 24, 1948, now Patent 2,560,594, granted July 17, 1951, of G. L. Pearson.

Figure 1:
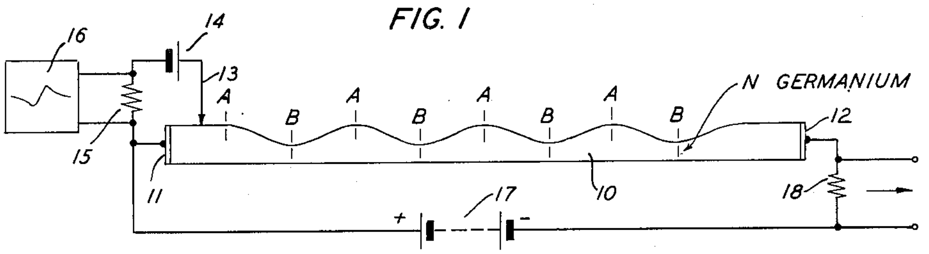
Fig. 1 is a diagram showing a frequency selective circuit illustrative of one embodiment of this invention.

Referring now to the drawing, Fig. 1 depicts a filter comprising a filament 10 of N conductivity type germanium, for example, ohmic connections 11 and 12 to opposite ends of the filament, the connection 11 constituting the base and the connection 12 serving as the collector, and an emitter 13, for example a point contact, bearing against the germanium filament adjacent one end thereof as shown. The emitter 13 is biased in the forward direction with respect to the body 10 as by a source 14 in series with an input resistor 15 across which input signals are applied from a source 16.

The collector 12 is biased in the reverse direction with respect to the body 10 by a suitable source 17 in series with a load impedance represented by the resistor 18. Thus, the source 17 is poled to establish in the filament a sweeping field to attract to the collector 12 the carriers injected at the emitter 13. Specifically, when the body 10 is of N conductivity type, the sources 13 and 17 are poled as shown in Fig. 1, holes are injected at the emitter 13, and these holes flow toward the collector 12.

As indicated in Fig. 1, the cross-sectional area of the germanium body varies cyclically along the length of the body. For example, the body may be of constant width, width being the dimension normal to the plane of the drawing, and the upper surface, in Fig. 1, may be of sinusoidal contour. Thus, if the body is of uniform resistivity throughout, the resistance per unit length will be a minimum at regions A and a maximum at regions B. As has been pointed out hereinabove, the resistivity of any unit volume of semiconductive material is dependent upon the concentration of charge carriers. Hence, when a signal pulse is applied from the source 16 and as a result a pulse of holes is injected at the emitter 13 and these flow along the filament, the number of holes present at each region A or B will be increased as the holes traverse that region and the resistivity of that region will be altered accordingly, i. e. decreased. Assuming no diminution in the number of holes as the pulse thereof traverses the filament, it will be noted that the percentage change in number of carriers at the several regions will be substantially the same. However, it will be noted also that because of the difference in the normal resistance at regions A and regions B, the absolute change in resistance due to the same percentage change in carriers will be greater at regions B than at regions A.

If the transit time between emitter and collector, of a pulse of injected holes is long in comparison to the frequency of the signal pulses, it is apparent that there will be no substantial change in the total number of holes in the filament. Also, it will be appreciated that if the filament were of uniform cross-section throughout, there would be substantially no net change in the impedance between the terminals 11 and 12 and, consequently, substantially no change in the current to the load.

However, if the semiconductor is of periodically varying cross-section, as indicated in Fig. 1, delayed replicas of the input signals can be obtained at the load 18 when certain parameters are correlated in the manner which will be clear from the following considerations. Assume that the period of the input pulses is equal to the transit time of the injected carriers between points of equal resistance in the filament. Then at one point of time, all the pulse hole groups will be at the regions B thus appreciably decreasing the resistance between the terminals 11 and 12 and decreasing the voltage drop between these terminals. A half cycle later, all the hole groups will be at regions A. At this time there will be some decrease in the resistance between the terminals 11 and 12 but, for reasons which have been noted hereinabove, this decrease will be small in comparison to the decrease for the case when the pulses are at positions B. Hence, in effect, the voltage drop between terminals 11 and 12 varies in accordance with the input signals whereby corresponding variations obtain at the load 18.

It will be noted that this result is realized for the condition that the spacing of the hole groups along the filament is equal, or substantially so, to the spacing of the regions A, or of the regions B. If this equality, or what may be considered as a resonance, does not obtain, it will be seen that little, if any, output will be realized at the load 18. Thus, the device constitutes a frequency selective network or filter.

The equality or resonance noted is dependent primarily upon two factors namely the spacing of successive regions A, or B, and the sweeping field due to the source 17. For any fixed value of the spacing, the device may be tuned, in effect, to a desired ferquency by appropriate adjustment of the potential of source 17. Thus, a given structure may be utilized as a filter to pass any one of a variety of frequencies, the particular frequency being fixed by adjustment of the source 17.

Figure 2:
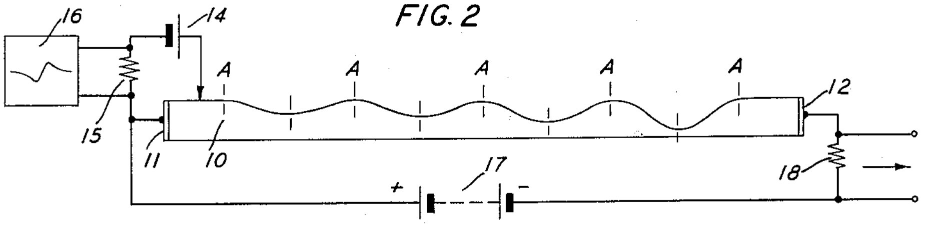
Figs. 2 and 3 depict modifications of the semiconductive element included in the circuit shown in Fig. 1.
Figure 3:
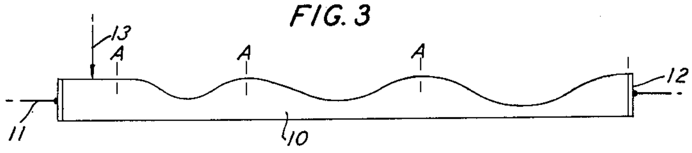

The transmission characteristics of devices constructed in accordance with this invention are readily amenable to design control to meet particular requirements or to take account of particular factors. For example, the effects of carrier recombination, notably decay in the number of carriers at successive regions in the path followed by the carriers traversing the semiconductor element may be compensated for readily. As illustrated in Fig. 2, the spacing of successive regions A may be constant and the thickness of the filament 10 decreased progressively along the filament so that, in the case of N-type material, the hole density has increasingly greater relative effect at successive regions, to the right, to compensate for the decrease in number of transmitted holes occasioned by recombination. Also, as illustrated in Fig. 3, the spacing between successive regions A may increase progressively to compensate for increases in field gradient. Also, the thickness may be varied, as in Fig. 2, to compensate for hole decay.

Figure 4A:
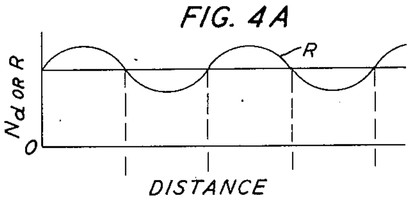
Figs. 4A and 4B illustrate another embodiment of this invention wherein the resistivity variations in the semiconductor body obtain by prescribed variations in impurity concentration in the body.
Figure 4B:
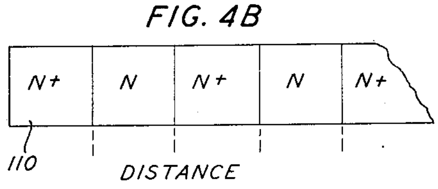

The systematic variation in normal resistance per unit length of the semiconductive body may be provided also by controlling the impurity concentration. Specifically, as illustrated in Figs. 4A and 4B, successive zones of the semiconductive body 110 may be made of different conductivities, N+ being relatively high conductivity and N being relatively low. Within each zone, the donor concentration $N_d$ may vary with distance as indicated in Fig. 4A whereby the resistance along the body varies substantially sinusoidally as portrayed by the curve R. The variation in donor concentration may be effected by control of the impurity concentration in the melt from which a crystal is drawn, in the manner disclosed in the application of G. K. Teal identified hereinabove.

In the embodiment of this invention illustrated in Fig. 5, the semiconductive, e. g. N-type germanium, body or filament 210 is of substantially uniform cross-section throughout its length and has ohmic connections 11 and 12 to opposite ends thereof. Bearing against the filament or body 210 are a plurality of collector electrodes 20, for example point contacts, biased by source 21 to attract carriers injected at the emitter 13. The adjacent collectors 20 are so spaced that the transit time of carriers between successive collectors is substantially equal to the period of the input signals applied to the emitter 13. Hence, for such signals in resonance with the collector spacings, the outputs of the several collectors will be in phase. For signals of other frequencies, the outputs will be out of phase so that the combined output is small in comparison to that for the resonance case. Thus, the device of Fig. 5 is frequency selective, providing a substantial output to the load 22 only for input signals of a prescribed frequency.

It will be noted that in devices such as that illustrated in Fig. 1 the maximum modulation of resistance of the filament occurs at a fixed time after the application of the input signal pulse. For example, in the device illustrated in Fig. 1, there is a finite delay between the injection of the carriers at the emitter 13 and the modulation of these carriers of the conductivity at the left most region B. The absolute amplitude of this delay will be determined by the transit time of the carriers and this in turn is determined by the sweeping field.

This principle may be utilized to advantage to provide preassigned delay in the transmission of signals. One illustrative device for effecting such result is portrayed in Fig. 6 and comprises the semiconductive body or filament 310 having therein a constriction 25 adjacent the collector 12. Delayed replicas of input signals impressed upon the resistor 15 are obtained at the load 18, the delay being equal to the transit time of the injected carriers in flowing from the emitter 13 to the constriction 25. This time may be varied by appropriate adjustment of the sweeping field due to the source 17.

From the standpoint of frequency stability, it is advantageous in devices of the constructions illustrated and described hereinabove that the drift velocities of the carriers be substantially the same through out the semiconductive body. This desideratum can be realized by utilizing constant current sources for the input and biases and employing an emitter for which the fraction of the total emitter current, carried by the injected carriers, i. e. holes for N-type semiconductors, is substantially constant.

Also advantageously, to minimize the effects of spreading of the hole groups as they traverse the semiconductor in flowing to the collector, the input signals are of the general form indicated on the source 16, that is on the positive half cycle the pulses have sharp rise time and relative slow decay time.

Although the invention has been described hereinabove with particular reference to devices including N-type semiconductors, it may be embodied also in devices using P-type semiconductors. Further, although the invention has been described with particular reference to devices having point contact emitters, PN junction emitters, such as disclosed in Electrons and Holes in Semiconductors by W. Shockley, 1950, pages 86 et seq. also may be used. Such junctions may be employed also in place of point contact collectors in devices such as that illustrated in Fig. 5.

Finally, it will be understood that the several embodiments of the invention shown and described are but illustrative and that various modifications may be made therein without departing from the scope and spirit of this invention.

What is claimed is:

1. A signal transmitting device comprising an elongated body of semiconductive material of one conductivity type and having therein a series of spaced regions the resistance per unit length of which is substantially greater than the resistance per unit length of the regions intermediate between said spaced regions, means including an emitter connection to said body adjacent one end and a signal source for injecting carriers into said body, a collector connection to said body at the other end thereof, and means for establishing in said body an electric field of polarity to attract the injected carriers toward said collector connections, the period of signals from said source being less than one-half of the transit time of said injected carriers from said emitter connection to said collector connection.

2. A signal transmitting device comprising a body of semiconductive material of one conductivity type the resistance per unit length of which varies cyclically through several cycles between two opposite regions of said body, an emitter connection to said body at one of said regions, a collector connection to said body at the other of said regions, and a base connection to said body.

3. A signal transmitting device comprising an elongated body of semiconductive material, the resistance per unit length of which varies cyclically through a plurality of cycles between the ends of said body, a base connection to one end of said body, a collector connection to the other end of said body, an emitter connection to said body adjacent said one end, means biasing said collector relative to said base at the polarity to attract to said collector carriers of the sign opposite that of the carriers normally in excess in said body, and means for energizing said emitter to inject into said body carriers of said opposite sign at a frequency such that for a prescribed collector bias the period of the injected carriers is substantially equal to the carrier transit time between successive regions of equal resistance along said body.

4. A frequency selective device comprising a filament of germanium, the resistance per unit length of which varies cyclically through a plurality of cycles along the length of the filament, base and collector connections to opposite ends of said filament, source means biasing said collector relative to said base to attract thereto carriers of the sign opposite that of the carriers normally in excess in said filament, and means including an emitter connection to said filament adjacent the base end thereof for injecting into said filament pulses of carriers of said opposite sign, the period of at least certain of said pulses in traversing said filament, for a given collector bias being substantially equal to the carrier transit time between successive regions of equal resistance along said filament.

5. A frequency selective device according to claim 4 in which the cross section of the filament varies cyclically through a plurality of cycles along the length of the filament.

6. A frequency selective device according to claim 4 in which the concentration of significant impurities varies cyclically through a plurality of cycles along the length of the filament.

7. A signal transmitting device comprising a body of semiconductive material of one conductivity type having axially a first series of spaced regions of a first resistance interleaved with a second series of regions of different resistance, characterized in that the difference in the resistances between pairs of adjacent regions taken from said first and second series increases with distance along the length of the body, emitter and collector connections at opposite ends of the body, and a base connection to the body.

8. A signal transmitting device comprising a body of semiconductive material of one conductivity type having a first series of spaced regions of a first resistance interleaved with a second series of regions of a different resistance characterized in that the spacing between regions of said first series varies along the length of the body, emitter and collector connections at opposite ends of the body, and the base connection to the body.

9. A signal transmitting device according to claim 7 in combination with a signal source connected to the emitter connection for injecting carriers into said body, the period of signals from said source being substantially equal to the transit time of the carriers in their travel between adjacent regions of said first series.

10. A signal transmitting device according to claim 8 in combination with a signal source connected to said emitter connection for injecting carriers into the body, the period of signals from said source being substantially equal to the transit time of said carriers in their travel between adjacent regions of said first series.

References Cited in the file of this patent

UNITED STATES PATENTS

| | | |
|---|---|---|
| 2,205,873 | Breschbeck | June 25, 1940 |
| 2,502,479 | Pearson et al. | Apr. 4, 1950 |
| 2,553,490 | Wallace | May 15, 1951 |
| 2,569,347 | Shockley | Sept. 25, 1951 |
| 2,600,500 | Haynes et al. | June 17, 1952 |